United States Patent
Raberg

(10) Patent No.: US 9,411,024 B2
(45) Date of Patent: Aug. 9, 2016

(54) MAGNETIC FIELD SENSOR HAVING XMR ELEMENTS IN A FULL BRIDGE CIRCUIT HAVING DIAGONAL ELEMENTS SHARING A SAME SHAPE ANISOTROPY

(75) Inventor: Wolfgang Raberg, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 575 days.

(21) Appl. No.: 13/451,737

(22) Filed: Apr. 20, 2012

(65) Prior Publication Data

US 2013/0278250 A1 Oct. 24, 2013

(51) Int. Cl.
*G01R 33/09* (2006.01)

(52) U.S. Cl.
CPC .............. *G01R 33/093* (2013.01); *G01R 33/09* (2013.01); *G01R 33/098* (2013.01)

(58) Field of Classification Search
CPC ..... G01R 33/09; G01R 33/093; G01R 33/098
USPC ............ 324/173–174, 207.2, 207.21, 207.25, 324/252
See application file for complete search history.

(56) References Cited

U.S. PATENT DOCUMENTS

| | | | | |
|---|---|---|---|---|
| 3,341,772 | A * | 9/1967 | Weiss | 324/252 |
| 4,255,708 | A * | 3/1981 | Wilson, III | 324/207.21 |
| 4,480,248 | A * | 10/1984 | Sudo et al. | 338/32 R |
| 6,373,242 | B1 * | 4/2002 | Wappling | 324/207.21 |
| 6,580,587 | B1 | 6/2003 | Everitt | |
| 6,640,652 | B2 * | 11/2003 | Kikuchi et al. | 73/862.333 |
| 7,005,958 | B2 * | 2/2006 | Wan | 338/32 R |
| 7,312,609 | B2 * | 12/2007 | Schmollngruber et al. | 324/252 |
| 7,358,723 | B2 * | 4/2008 | Hinz et al. | 324/252 |
| 7,956,610 | B2 | 6/2011 | Granig et al. | |
| 8,207,732 | B2 * | 6/2012 | Bartos et al. | 324/252 |
| 2003/0070497 | A1 * | 4/2003 | Kikuchi et al. | 73/862.333 |
| 2008/0191694 | A1 * | 8/2008 | Barton et al. | 324/252 |
| 2008/0278158 | A1 | 11/2008 | Granig et al. | |
| 2009/0058402 | A1 | 3/2009 | Zimmer et al. | |
| 2010/0213933 | A1 * | 8/2010 | Mather et al. | 324/252 |
| 2011/0156798 | A1 * | 6/2011 | Ide et al. | 327/510 |
| 2011/0210727 | A1 | 9/2011 | Ausserlechner | |
| 2013/0241544 | A1 * | 9/2013 | Zimmer | 324/252 |
| 2013/0300409 | A1 | 11/2013 | Deak et al. | |
| 2014/0035573 | A1 | 2/2014 | Deak et al. | |

FOREIGN PATENT DOCUMENTS

| | | |
|---|---|---|
| DE | 260773 A1 | 10/1988 |
| DE | 4335826 A1 | 4/1995 |

(Continued)

OTHER PUBLICATIONS

H. Hauser, et al. "Magnetoresistive Sensors" Retrieved From http://www.iemw.tuwien.ac.at/publication/workshop0600/Hauser.html 12 Pages.

*Primary Examiner* — Jay Patidar
(74) *Attorney, Agent, or Firm* — Eschweiler & Associates, LLC

(57) ABSTRACT

Embodiments of the present invention provide a magnetic field sensor. The magnetic field sensor includes at least four XMR elements connected in a full bridge circuit including parallel branches. The at least four XMR elements are GMR or TMR elements (GMR=giant magnetoresistance; TMR=tunnel magnetoresistance). Two diagonal XMR elements of the full bridge circuit include the same shape anisotropy, wherein XMR elements in the same branch of the full bridge circuit include different shape anisotropies.

16 Claims, 7 Drawing Sheets

(56) References Cited

FOREIGN PATENT DOCUMENTS

| DE | 19507303 | A1 | 9/1996 |
| DE | 10342260 | A1 | 4/2005 |
| DE | 102007021320 | A1 | 11/2008 |
| WO | 2005026746 | A3 | 6/2005 |

* cited by examiner

MAGNETIC FIELD SENSOR HAVING XMR ELEMENTS IN A FULL BRIDGE CIRCUIT HAVING DIAGONAL ELEMENTS SHARING A SAME SHAPE ANISOTROPY

TECHNICAL FIELD

Embodiments of the present invention relate to magnetic field sensors. Further embodiments of the present invention relate to robust GMR monocells (GMR=giant magnetoresistance). Further embodiments of the present invention relate to magnetoresistive sensors, based on XMR technology, for wheel speed sensor applications such as crankshaft, camshaft, transmission and ABS sensing applications.

BACKGROUND

Magnetic field sensors can be used for a variety of applications, such as for detecting a position, speed or acceleration of a body. In some applications, the body can be a wheel attached to a shaft, wherein the magnetic field sensor can be used to detect a rotational position, angle, speed or acceleration of the wheel.

SUMMARY

Embodiments of the present invention provide a magnetic field sensor. The magnetic field sensor comprises at least four XMR elements connected in a full bridge circuit comprising parallel branches. The at least four XMR elements are GMR or TMR elements (GMR=giant magnetoresistance; TMR=tunnel magnetoresistance). Two diagonal XMR elements of the full bridge circuit comprise the same shape anisotropy, wherein XMR elements in the same branch of the full bridge circuit comprise different shape anisotropies.

Further embodiments of the present invention provide a magnetic field sensor comprising a first and a second supply terminal and at least two branches. A first branch of the at least two branches comprises a series connection of a first and a second XMR element. A second branch of the at least two branches comprises a series connection of a third and a fourth XMR element. The first and second branches are connected in parallel between the first and second supply terminals, such that the first and third XMR elements are connected to the first supply terminal and the second and fourth XMR elements are connected to the second supply terminal. The first and fourth XMR elements comprise the same shape anisotropy, wherein the first and second XMR elements comprise different shape anisotropies, and wherein the third and fourth XMR elements comprise different shape anisotropies. The XMR elements are GMR or TMR elements.

Further embodiments of the present invention provide a method for providing a sensor signal of a magnetic field sensor, wherein the magnetic field sensor comprises at least four XMR elements connected in a full bridge circuit comprising parallel branches, wherein two diagonal XMR elements of the full bridge circuit comprise the same shape anisotropy, and wherein XMR elements in the same branch of the full bridge circuit comprise different shape anisotropies. The method comprises detecting a bridge signal of the full bridge circuit, wherein the bridge signal comprises a sequence of bridge signal values, and detecting a single element signal of one of the at least four XMR sensor elements, wherein the single element signal comprises a sequence of the single element signal values. The method further comprises providing the bridge signal as the sensor signal if the bridge signal value is within a predefined bridge signal value range and if the single element signal value is within a predefined single element signal value range.

Some embodiments of the present invention provide a system comprising a body and at least four XMR elements. The body comprises a plurality of structures for effecting a periodically varying magnetic field upon movement of the body. The at least four XMR elements are connected in a full bridge circuit comprising parallel branches. The at least four XMR elements are GMR or TMR elements. Two diagonal XMR elements of the full bridge circuit comprise the same shape anisotropy, wherein XMR elements in the same branch of the full bridge circuit comprise different shape anisotropies. The at least four XMR elements are arranged adjacent to the body and configured to detect a component of the periodically varying magnetic field upon movement of the body.

BRIEF DESCRIPTION OF THE DRAWINGS

Embodiments of the present invention are described herein making reference to the appended drawings.

Figure 1:
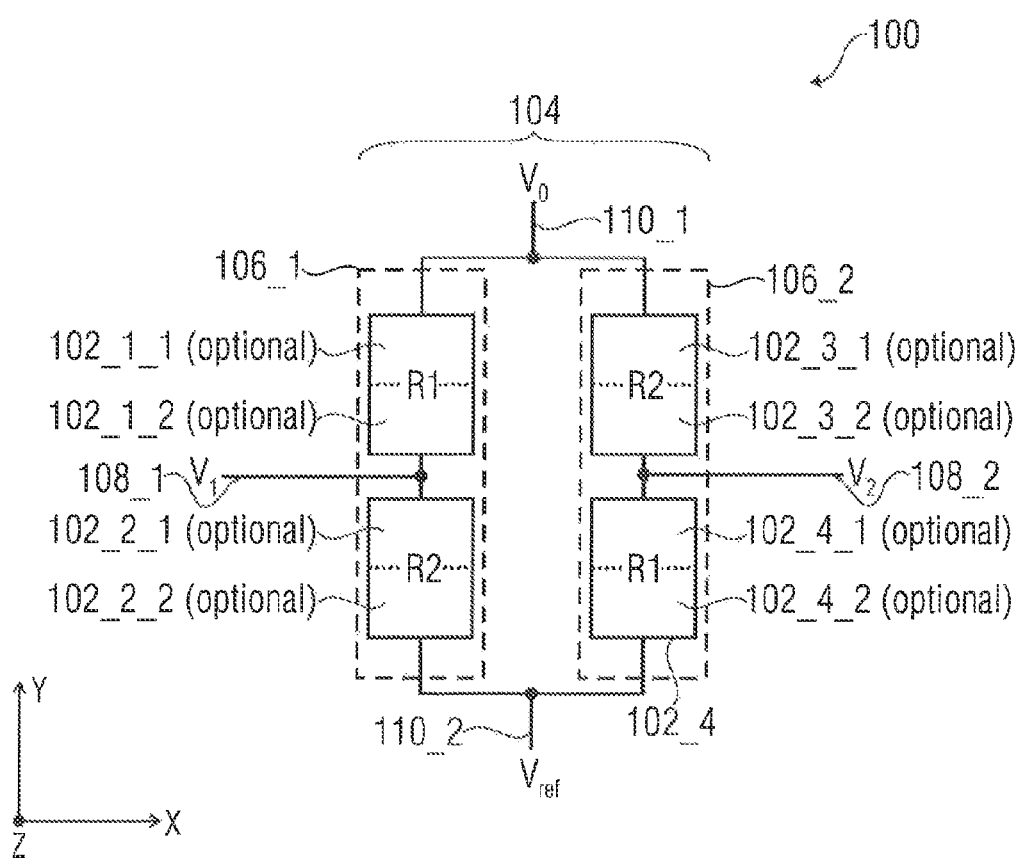
FIG. 1 shows a block diagram of a magnetic field sensor according to an embodiment of the present invention.

Equal or equivalent elements or elements with equal or equivalent functionality are denoted in the following description by equal or equivalent reference numerals.

DETAILED DESCRIPTION

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a block diagram of a magnetic field sensor 100 according to an embodiment of the present invention. The magnetic field sensor 100 comprises at least four XMR elements 102_1 to 102_n (n≥4) connected in a full bridge circuit 104 comprising parallel branches 106_1 to 106_m, wherein the at least four XMR elements 102_1 to 102_n (n≥4) are GMR or TMR elements (GMR=giant magnetoresistance; TMR=tunnel magnetoresistance). Two diagonal XMR elements of the full bridge circuit 104 comprise the same shape anisotropy, wherein XMR elements in the same branch 106_1 to 106_m of the full bridge circuit 104 comprise different shape anisotropies.

In embodiments, XMR elements may refer either to GMR elements or TMR elements, or a combination of both.

The magnetic field sensor 100 shown in FIG. 1 comprises, for example, four XMR elements 102_1 to 102_n (n=4) connected in a full bridge circuit 104 comprising two parallel branches 106_1 to 106_m (m=2). The first branch 106_1 of the two branches 106_1 to 106_m (m=2) can comprise a series connection of a first and second XMR element 102_1 and 102_2 of the four XMR elements 102_1 to 102_n (n=4), wherein the second branch 106_2 of the two branches 106_1 to 106_m (m=2) can comprise a series connection of a third and fourth XMR element 102_3 to 102_4 of the four XMR elements 102_1 to 102_n (n=4).

Naturally, the magnetic field sensor 100 can comprise n XMR elements 102_1 to 102_n connected in a full bridge circuit 104 comprising m parallel branches 106_1 to 106_m, wherein n is a natural number greater than or equal to four (n≥4), wherein m is a natural number greater than or equal to two (m≥2). In some embodiments, the number m of parallel branches 106_1 to 106_m can be equal to the number n of XMR elements 102_1 to 102_n divided by two (m=n/2), such that each branch of the full bridge circuit 104 comprises two XMR elements.

As shown in FIG. 1, the parallel branches 106_1 to 106_m (m=2) can be connected in parallel between a first and second supply terminal 110_1 and 110_2 of the full bridge circuit 104. Furthermore, the parallel branches 106_1 to 106_m (m=2) of the full bridge circuit 104 can comprise bridge terminals 108_1 to 108_m (m=2) connected between the XMR elements 102_1 to 102_n (n=4).

In other words, the magnetic field sensor 100 can comprise a first and a second supply terminal 110_1 and 110_2 and at least two branches 106_1 to 106_m (m≥2). A first branch 106_1 of the at least two branches 106_1 to 106_m (m≥2) can comprise a series connection of a first and a second XMR element 102_1 and 102_2. A second branch 106_2 of the at least two branches 106_1 to 106_m (m≥2) can comprise a series connection of a third and a fourth XMR element 102_3 and 102_4. The first and second branches 106_1 and 106_2 can be connected in parallel between the first and second supply terminals 110_1 and 110_2, such that the first and third XMR elements 102_1 and 102_3 are connected to the first supply terminal 110_1 and the second and fourth XMR elements 102_2 and 102_4 are connected to the second supply terminal 110_2. The first and fourth XMR elements 102_1 and 102_4 can comprise the same shape anisotropy, wherein the first and second XMR elements 102_1 and 102_2 can comprise different shape anisotropies, and wherein the third and fourth XMR elements 102_3 and 102_4 can comprise different shape anisotropies. The XMR elements 102_1 to 102_n (n=4) are GMR or TMR elements.

As shown in FIG. 1, two diagonal XMR elements of the full bridge circuit 104, for example, the first and fourth XMR elements 102_1 and 102_4, comprise the same shape anisotropy, wherein XMR elements in the same branch 106_1 to 106_2 of the full bridge circuit 104, for example, the first and second XMR elements 102_1 and 102_2 and/or the third and fourth XMR elements 102_3 and 102_4, comprise different shape anisotropies. Furthermore, the second and third XMR elements 102_2 and 102_3 can comprise the same shape anisotropy In some embodiments, the resistances or the resistive behavior of the at least four XMR elements 102_1 to 102_4 (n≥4) can be defined by the shape anisotropies of the same. Hence, in the appended drawings different shape anisotropies may be indicated by different resistances, such as R1 and R2.

For example, in FIG. 1, the first and fourth XMR elements 102_1 and 102_4 comprise a first resistance R1, wherein the second and third XMR elements 102_2 and 102_3 comprise a second resistance R2 different from the first resistance.

In some embodiments, the at least four XMR elements 102_1 to 102_4 (n≥4) can be configured to detect the same component of an external magnetic field. For example, the at least four XMR elements 102_1 to 102_4 (n≥4) can be arranged to have the same sensing plane. In other words, the active or sensitive areas of the at least four XMR elements 102_1 to 102_4 (n≥4) are in the same plane.

Some of the appended drawings show an x-y-z-reference coordinate system having an x-axis, y-axis and z-axis (substantially) perpendicular to each other. The x-axis and the y-axis define a plane or dimension parallel to the active or sensitive area (sensing plane) of the at least four XMR elements 102_1 to 102_n (n≥4), wherein the z-axis defines a dimension perpendicular to the active or sensitive area of the at least four XMR elements 102_1 to 102_n (n≥4).

In some embodiments, the shape anisotropies of the at least four XMR elements 102_1 to 102_n (n≥4) can be defined by aspect ratios of the same, wherein the aspect ratios are defined by quotients between width and length in the sensing plane (e.g. xy-plane) of the at least four XMR elements 102_1 to 102_n (n=4).

For example, referring to FIG. 1, the width of the XMR-elements 102_1 to 102_n can be measured along an x-direction parallel to the x-axis of the reference coordinate system, wherein the length of the XMR-elements 102_1 to 102_n can be measured along an y-direction parallel to the y-axis of the reference coordinate system. Moreover, the sensing plane of the XMR-elements 102_1 to 102_n can be parallel to the plane defined by the x-axis and the y-axis of the reference coordinate system.

In some embodiments, the two diagonal XMR elements of the full bridge circuit 104 can comprise a first aspect ratio defining a first shape anisotropy, wherein the other two diagonal XMR elements of the full bridge circuit 104 comprise a second aspect ratio defining a second shape anisotropy.

For example, referring to FIG. 1, the two diagonal XMR elements 102_1 and 102_4 can comprise a first aspect ratio defining a first shape anisotropy (indicated by R1), wherein the other two diagonal XMR elements 102_2 and 102_3 of the full bridge circuit 104 can comprise a second aspect ratio defining a second shape anisotropy (indicated by R2).

Different shape anisotropies of the XMR-elements 102_1 to 102_n can be realized by different widths and/or lengths of the XMR-elements 102_1 to 102_n. For example, the two diagonal XMR elements 102_1 and 102_4 of the full bridge circuit 104 can comprise a different width and/or length than the other two diagonal XMR elements 102_2 and 102_3 of the full bridge circuit 104.

In some embodiments, the second aspect ratio can be by a factor of 1.5 to 5 (or 2 to 4.5, or 2.5 to 4, or 3 to 3.5) smaller than the first aspect ratio. For example, the first and fourth XMR elements 102_1 and 102_4 can comprise a first aspect ratio defining a first shape anisotropy requiring an external magnetic field component having a magnetic flux density between 15 to 25 mT for saturation, wherein the second and third XMR elements 102_2 and 102_3 can comprise a second aspect ratio defining a second shape anisotropy requiring an external magnetic field component having a flux density between 5 to 10 mT for saturation.

In some embodiments, the at least four XMR elements 102_1 to 102_n (n≥4) can be configured to detect the same (in-plane) component of an external magnetic field. For example, referring to FIG. 1, the XMR sensors 102_1 to 102_4 can be configured to detect the x-component and/or y-component of an external magnetic field.

In some embodiments, at least one XMR element of the at least four XMR elements 102_1 to 102_n (n≥4) can comprise at least two XMR sub elements (102 1 1, 102 1 2 to 102 n 1, 102 n 2 (n≥4)), wherein the at least two XMR sub elements comprise a total shape anisotropy corresponding to the one XMR element. Moreover, the at least two XMR sub elements can comprise substantially the same shape anisotropy. Note that the transfer function of the single element can be slightly different.

For example, the first XMR element 102_1 comprising the first shape anisotropy can comprise a first and a second XMR sub element (102 1 1, 102 1 2), wherein the first and second XMR sub elements (102 1 1, 102 1 2) comprise a total shape anisotropy corresponding to the first shape anisotropy, e.g. the total shape anisotropy of the first and second XMR sub elements (102 1 1, 102 1 2) can be equal to the first shape anisotropy. Naturally, also the second, third and/or fourth XMR element(s) can comprise XMR sub elements (102 2 1, 102 2 2 to 102 n 1, 102 n 2 _(n≥4)).

As already mentioned, the parallel branches 106_1 to 106_m of the full bridge circuit 104 can comprise bridge terminals 108_1 to 108_m connected between the XMR elements 102_1 to 102_n. In presence of an in-plane component of an external magnetic field a bridge signal is present between the bridge terminals 108_1 and to 108_m. Furthermore, the parallel branches 106_1 to 106_m can be connected in parallel between a first and a second supply terminal 110_1 to 110_2 of the full bridge circuit 104.

For example, referring to FIG. 1, the first branch 106_1 of the full bridge circuit 104 can comprise a first bridge terminal 108_1 connected between the series connection of the first and second XMR elements 102_1 and 102_2, wherein the second branch 106_2 of the full bridge circuit 104 can comprise a second bridge terminal 108_2 connected between the series connection of the third and fourth XMR elements 102_3 and 102_4. Furthermore, the first branch 106_1 and the second branch 106_2 can be connected in parallel between the first and second supply terminals 110_1 and 110_2, such that the first and third XMR elements 102_1 and 102_3 are connected to the first supply terminal 110_1, wherein the second and fourth XMR elements 102_2 and 102_4 are connected to the second supply terminal 110_2. The first supply terminal 110_1 can be connected to a supply potential $V_0$ (e.g. a positive or negative supply voltage), wherein the second supply terminal 110_2 can be connected to a reference potential $V_{ref}$ (e.g. ground).

In presence of an in-plane component (e.g. x-component or y-component) of an external magnetic field a bridge signal $\Delta V$ is present between the bridge terminals 108_1 and 108_2. The bridge signal $\Delta V$ can be the difference between a first bridge potential V1 present at the first bridge terminal 102_1 and a second bridge potential $V_2$ present at the second bridge terminal 108_2. The first bridge potential $V_1$ can be calculated to:

$$V_1(V_0 - V_{ref}) \frac{R_1}{R_1 + R_2} \quad (1)$$

Thereby, $R_1$ is the resistance of the first and fourth XMR elements 102_1 and 102_4, wherein $R_2$ is the resistance of the second and third XMR elements 102_2 and 102_3. The second bridge potential $V_2$ can be calculated to:

$$V_2(V_0 - V_{ref}) \frac{R_2}{R_1 + R_2} \quad (2)$$

If the reference potential $V_{ref}$ is a ground potential, then the first and second bridge potentials $V_1$ and $V_2$ can be calculated to:

$$V_1 = V_0 \frac{R_1}{R_1 + R_2} \quad (3)$$

$$V_2 = V_0 \frac{R_2}{R_1 + R_2} \quad (4)$$

In the following, a possible realization of the magnetic field sensor 100 shown in FIG. 1 and of the XMR elements 104_1 to 104_n (n≥4) is described in detail.

In a number of applications it is important to tightly control the position of a wheelshaft regardless of the rotation speed of the wheelshaft. Commonly, this is done using magnetic sensors based on the Hall effect which detect the magnetic field generated by a magnetic encoder wheel which is mounted on the shaft to be controlled. Another class of systems use sensors based on magnetoresistive effects such as the anisotropic magnetoresistive effect (AMR), the giant magnetoresistive effect (GMR) or the tunnelling magnetoresistive effect (TMR).

If XMR technology is used, a differential wheatstone-like approach is necessary to avoid issues due to thermal drifts. For AMR this is typically done by tilting the current flow ±45° with respect to the encoder field axis. For typical spinvalve-like GMR or TMR elements this can be achieved either by locally different magnetization (which is quite difficult, and requires compromises in signal amplitude) or by spatial separation of the resistive elements. The latter works well if the spacing between the two halves of the bridge corresponds to half the polewheel pitch. Any deviation from this pitch match will lead to a degradation of the differential signal amplitude and an increase of e.g. the signal jitter.

In other words, commonly used is either a spatially differential GMR bridge which has the disadvantage of pitch dependence, or a locally differential GMR-bridge which has the disadvantage of a complex magnetization process and typically lower signal amplitude.

In contrast to that, embodiments of the present invention provide a robust locally concentrated GMR or TMR element, which combines the advantages of XMR technology (e.g. large signal, low jitter) with robustness against offset drift (e.g. due to temperature).

Embodiments of the present invention put to use the fact that the electric output $\Delta V$ is determined by the response of the freelayer magnetization to the magnetic field which in turn is governed by its shape anisotropy. According to the concept of the present invention XMR elements 102_1 to 102_n (n≥4) with two different shape anisotropies are combined in a wheatstone bridge 104 configuration and the difference in response to an external magnetic field is used as measurement signal ΔV. This allows to make use (of at least a part) of the large XMR-signal while reducing the influence of temperature drifts to a minimum due to the differential setup. The shape anisotropy is defined, for example, by the element $102\_1$ to $102\_n$ (n≥4) width and thus does not require a change of the manufacturing process. However, the local concentration of the elements $102\_1$ to $102\_n$ (n≥4) solves the issue of pitch mismatch normally observed in a spatially differential setup and allows to shrink the ASIC (ASIC=application-specific integrated circuit) separately from the sensor element.

According to the concept of the present invention, a set of XMR sensor elements $102\_1$ to $102\_n$ (n≥4) with different shape anisotropies are used in a wheatstone bridge 104 configuration.

In the following, typical transfer curves of such devices (XMR elements $104\_1$ to $104\_n$ (n≥4)) are described making reference to FIGS. 2a and 2b.

Figure 2A:
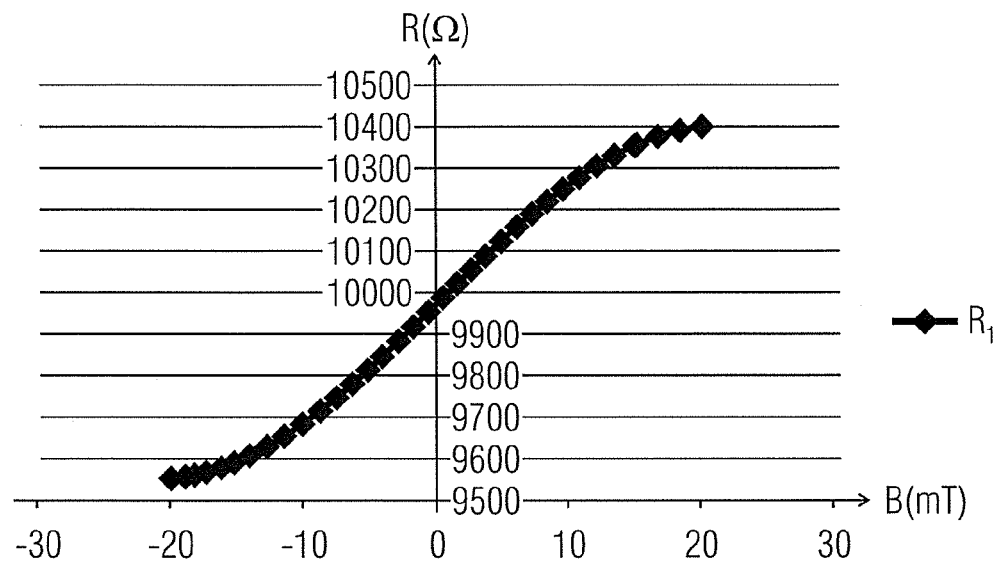
FIG. 2a shows a graph of a resistance of an XMR element comprising a first shape anisotropy as a function of a flux density of an in-plane component of an external magnetic field.

FIG. 2a shows a graph of a resistance of an XMR element comprising a first shape anisotropy as a function of a flux density of an in-plane component of an external magnetic field. Thereby, the ordinate describes the resistance of the XMR element comprising the first shape anisotropy in Ω, where the abscissa describes the flux density of the external magnetic field in mT.

Figure 2B:
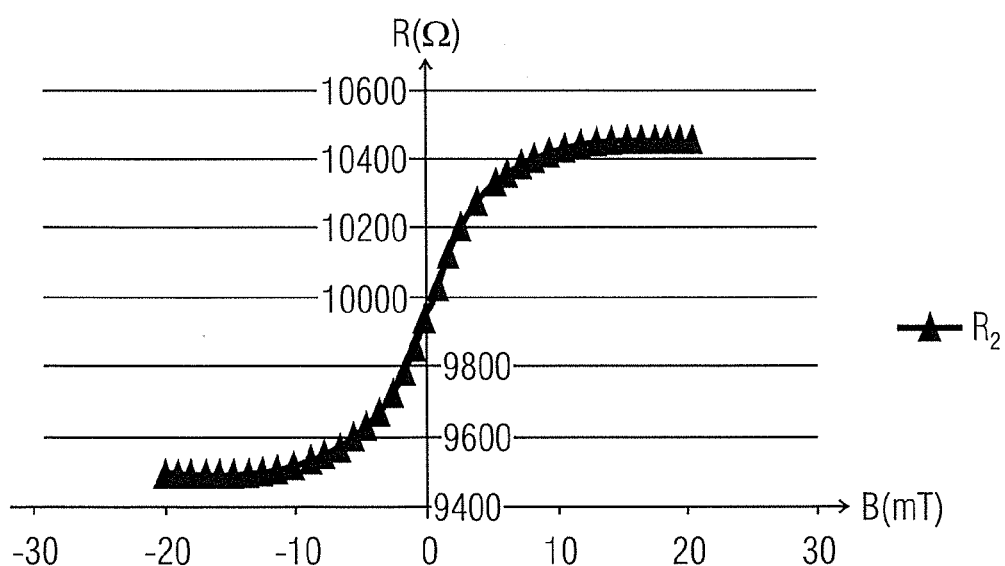
FIG. 2b shows a graph of a resistance of an XMR element comprising a second shape anisotropy as a function of the flux density of the in-plane component of the external magnetic field.

FIG. 2b shows a graph of a resistance of an XMR element comprising a second shape anisotropy as a function of the flux density of the in-plane component of the external magnetic field. Thereby, the ordinate describes the resistance of the XMR element comprising the second shape anisotropy in Ω, where the abscissa describes the flux density of the external magnetic field in mT.

A linear range of an XMR element can be defined as the range between, for example, 10% and 90% of the range between minima and maxima of the resistance of the XMR element.

Referring to FIG. 1, in some embodiments, the first and fourth XMR elements $102\_1$ and $102\_4$ (R1) can be realized by a resistive XMR element with large shape anisotropy and consequently large linear range such as shown in FIG. 2a, wherein the second and third XMR elements $102\_2$ and $102\_3$ (R2) can be realized by a resistive XMR element with a small shape anisotropy and consequently small linear range such as shown in FIG. 2b.

Figure 3:
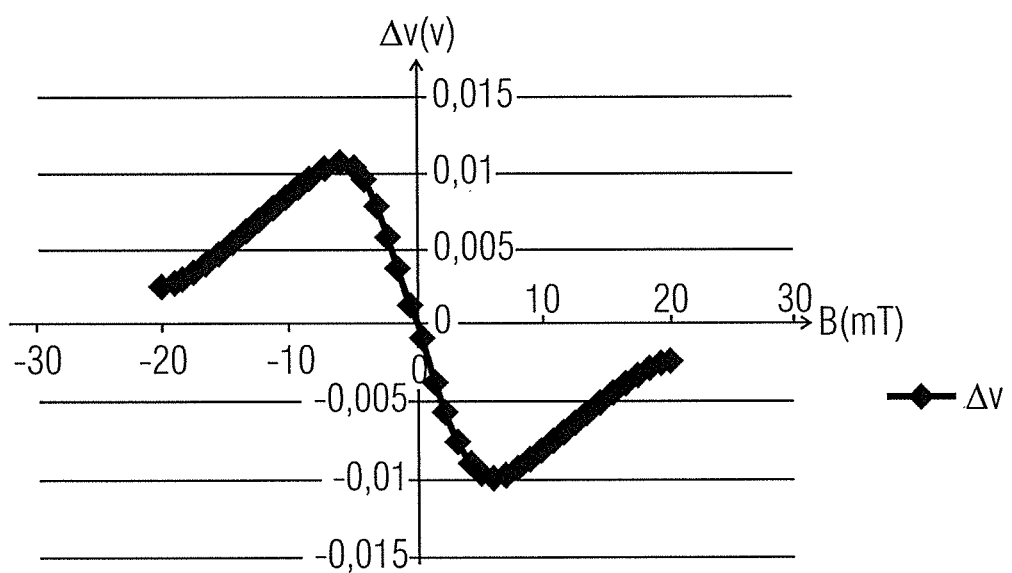
FIG. 3 shows a graph of the bridge signal present between the first and second bridge terminals of the magnetic field sensor as a function of the in-plane component of the external magnetic field.

FIG. 3 shows a diagram of the bridge signal ΔV present between the first and second bridge terminals $108\_1$ and $108\_2$ of the magnetic field sensor 100 as a function of the in-plane component of the external magnetic field. Thereby, the ordinate describes the bridge signal ΔV in V, where the abscissa describes a flux density of the in-plane component of the external magnetic field in mT. In other words, FIG. 3 shows the difference between the voltages V1 and V2 as a function of the applied field.

A linear range of the bridge signal ΔV can be defined as the range between, for example, 10% and 90% of the range between minima and maxima of the bridge signal ΔV.

At the same time, all drifts in resistance due to thermal effects will be the same for all elements $102\_1$ to $102\_n$ (n≥4) and thus cancel each other out. The linear range can be determined by the linear range of the resistance with the smaller shape anisotropy (second shape anisotropy). Ideally the shape anisotropy of the elements with the wide linear range is as large as possible to obtain maximum signal.

This device will work well if the field amplitude is within the linear range between the two extreme values. For field amplitudes larger than this linear range, additional measures are required to avoid misinterpretation of the signal. Luckily, because the linear range of the bridge is determined by the elements with the small linear range, those can serve as monitors. I.e. the output of the bridge is compared with the output of a single element, as will become clear from the following description.

Figure 4:
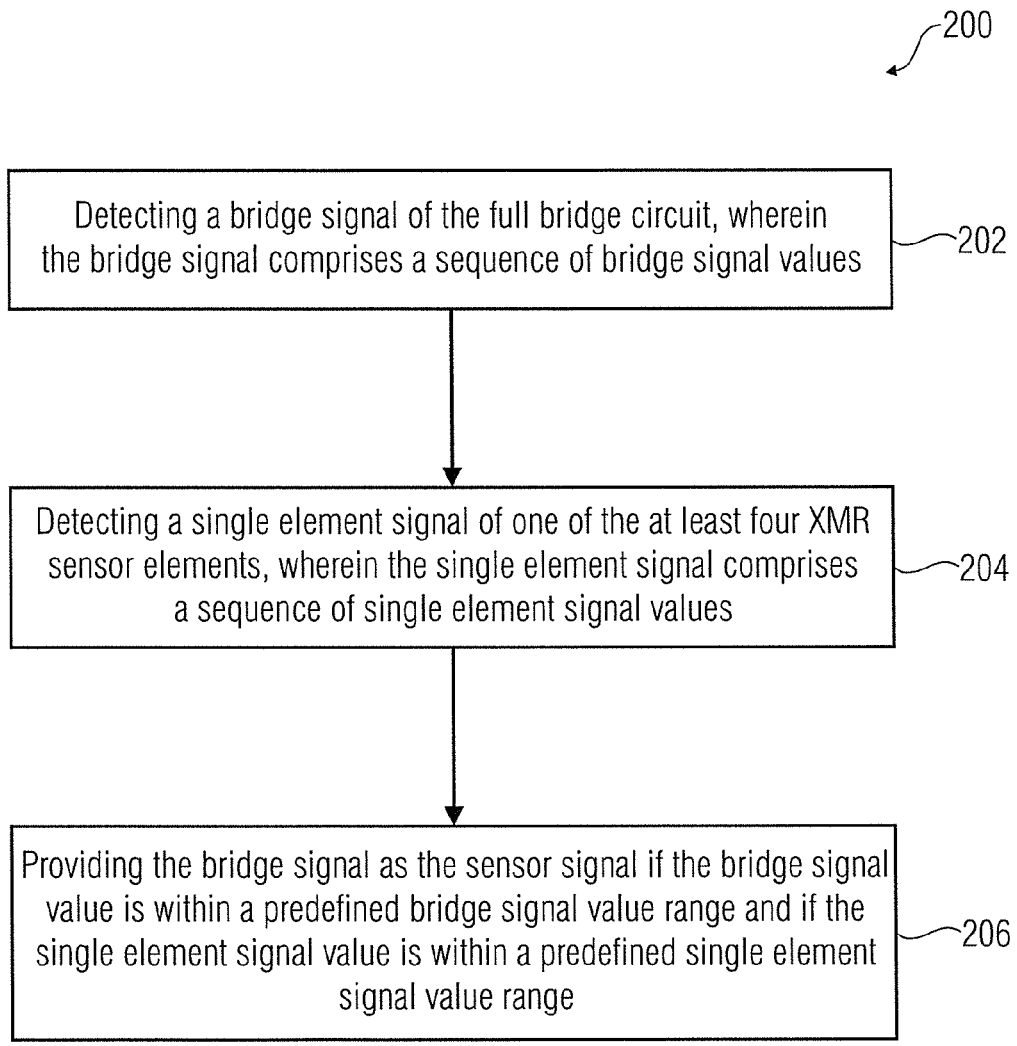
FIG. 4 shows a flow chart of a method for providing a sensor signal of a magnetic field sensor according to an embodiment of the present invention.

FIG. 4 shows a flow chart of a method 200 for providing a sensor signal of a magnetic field sensor 100 according to an embodiment of the present invention. The magnetic field sensor 100 can be the magnetic field sensor shown in FIG. 1 in one embodiment. The method comprises a step 202 of detecting a bridge signal ΔV of the full bridge circuit 104, wherein the bridge signal ΔV comprises a sequence of bridge signal values. The method 200 further comprises a step 204 of detecting a single element signal of one of the at least four XMR sensor elements $102\_1$ to $102\_n$ (n≥4), wherein the single element signal comprises a sequence of single element signal values. Lastly, the method 200 comprises a step 206 of providing the bridge signal ΔV as the sensor signal if the bridge signal value is within a predefined bridge signal value range and if the single element signal value is within a predefined single element signal value range.

In some embodiments, the sequence of bridge signal values can be a sequence of voltage or current values, wherein the sequence of single element signal values can be a sequence of voltage or current values.

The two diagonal XMR elements of the full bridge circuit 104 can comprise a first aspect ratio defining a first shape anisotropy, wherein the other two diagonal XMR elements of the full bridge circuit can comprise a second aspect ratio defining a second shape anisotropy, wherein the second aspect ratio is by a factor of 1.5 to 5 smaller than the first aspect ratio. In that case, the single element signal is detected of one of the two other XMR elements that comprise the second aspect ratio.

For example, referring to FIG. 1, the first and fourth XMR elements $102\_1$ and $102\_4$ can be the two diagonal XMR elements comprising the first shape anisotropy (R1), wherein the second and third XMR elements $102\_2$ and $102\_4$ can be the other two diagonal XMR elements comprising the second shape anisotropy (R2), smaller than the first shape anisotropy. In that case, the single element signal of the second or third XMR elements $102\_2$ or $102\_3$ can be detected.

Furthermore, the predefined bridge signal value range can comprise an upper threshold and a lower threshold, wherein the bridge signal value can be within the predefined bridge signal value range if the bridge signal value falls below the upper threshold or exceeds the lower threshold.

Referring to FIG. 3, the predefined bridge signal value range can be defined as the range between, for example, 10% and 90% (or 5% and 95%, or 20% and 80%, or 30% and 70%) of the range between the minimum value and maximum value of the bridge signal ΔV. The upper threshold can be 90% (or 95%, or 80%, or 70%) of the maximum value of the bridge signal ΔV. The lower threshold can be 90% (or 95%, or 80%, or 70%) of the minimum value of the bridge signal ΔV.

The method 200 can further comprise detecting a maximum bridge signal value and a minimum bridge signal value, and setting the upper threshold of the predefined bridge signal value range based on the detected maximum bridge signal value and setting the lower threshold of the predefined bridge signal value range based on the detected minimum bridge signal value.

Furthermore, the predefined single element signal value range can comprise an upper threshold and a lower threshold, wherein the single element signal value is within the predefined single element signal value range if the single element signal value falls below the upper threshold and exceeds the lower threshold.

For example, the single element signal value can be a voltage drop over the one XMR sensor element. The voltage drop over the one XMR sensor element is proportional to the resistance of the one XMR sensor element. The resistance of an XMR element as a function of the flux density of the in-plane component of the external magnetic field is shown in FIGS. 2a and 2b, respectively. Hence, the predefined single element signal value range can be defined as the range between, for example, 10% and 90% (or 5% and 95%, or 20% and 80%, or 30% and 70%) of the range between minimum value and maximum value of the voltage drop over the one XMR element. The upper threshold can be 90% (or 95%, or 80%, or 70%) of the maximum value of the voltage drop over the one XMR element. The lower threshold can be 10% (or 5%, or 20%, or 30%) of the minimum value of the voltage drop over the one XMR element.

The method 200 can further comprise detecting a maximum single element signal value and a minimum single element signal value, and setting the upper threshold of the predefined single element signal value range based on the detected maximum single element signal value and setting the lower threshold of the predefined single element signal value range based on the detected minimum single element signal value.

Figure 5:
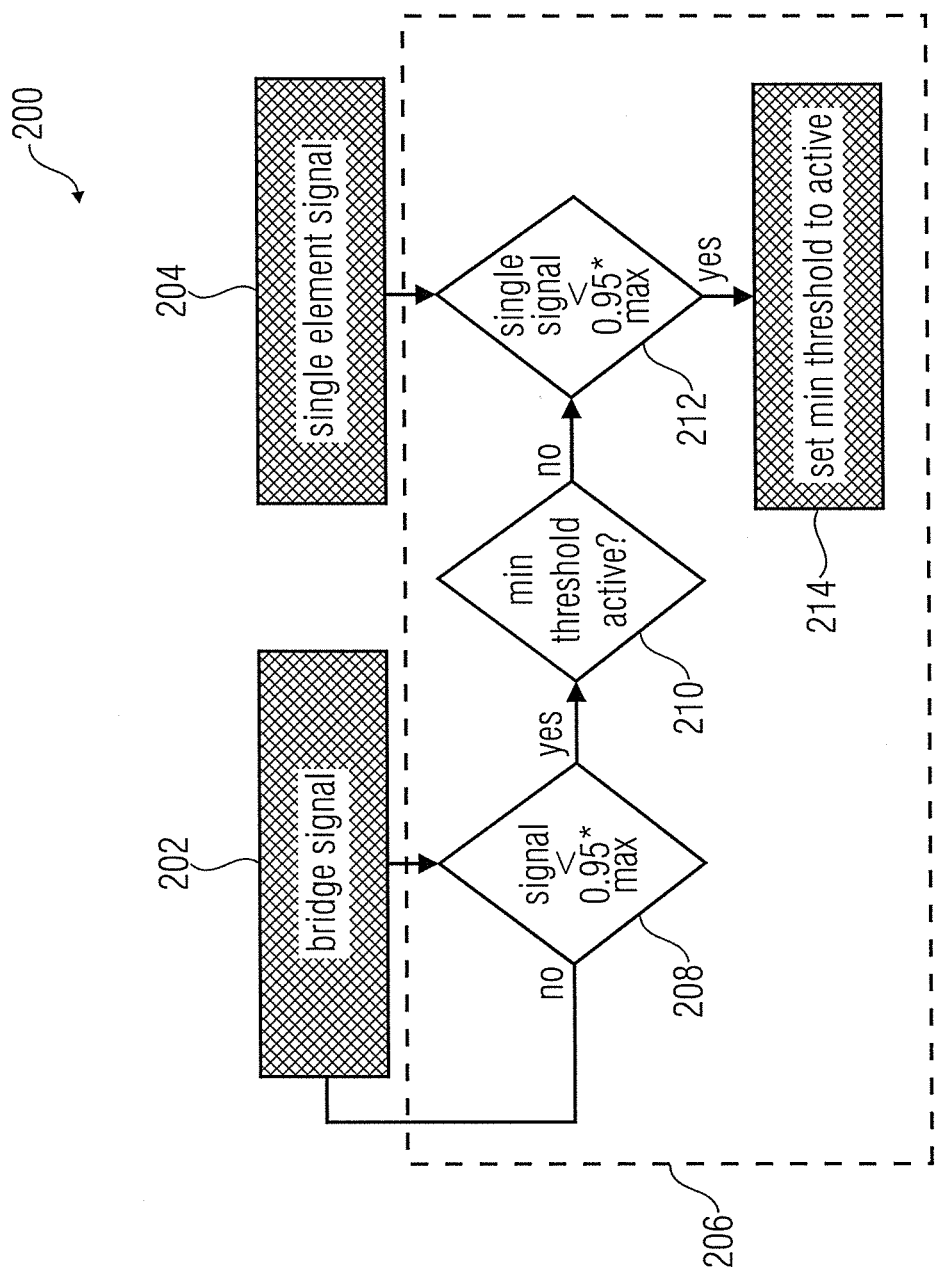
FIG. 5 shows a flow chart of the method for providing the sensor signal of the magnetic field sensor according to an another embodiment of the present invention.

FIG. 5 shows a flow chart of the method 200 for providing the sensor signal of the magnetic field sensor 100 according to another embodiment of the present invention. The method comprises the step 202 of detecting the bridge signal ΔV of the full bridge circuit 104, wherein the bridge signal ΔV comprises a sequence of bridge signal values. The method 200 further comprises the step 204 of detecting a single element signal of one of the at least four XMR sensor elements 102_1 to 102_n (n≥4), wherein the single element signal comprises a sequence of single element signal values. Lastly, the method 200 comprises the step 206 of providing the bridge signal ΔV as the sensor signal if the bridge signal value is within a predefined bridge signal value range and if the single element signal value is within a predefined single element signal value range.

The step 206 can comprise a step 208 of detecting whether the bridge signal value is within a predefined bridge signal value range, e.g., whether the bridge signal value is smaller than 95% of a maximum value of the bridge signal and/or whether the bridge signal value is greater than 5% of a minimum value of the bridge signal. If the bridge signal value is within the predefined bridge signal value range (YES at 208), then in a step 210 it is detected whether the bridge signal value was within the predefined bridge signal value range before (min threshold active). If the bridge signal value was not within the predefined bridge signal value range before (min threshold not active, NO at 210) then in a step 212 it is detected whether the single element signal value is within the predefined single element signal value range, e.g., whether the single element signal value is smaller than 95% of a maximum value of the single element signal and/or whether the single element signal value is greater than 5% of a minimum value of the single element signal. If the single element signal value is within the predefined single element signal value range (YES at 212), then in a step 214 the bridge signal ΔV is provided as the sensor signal (and the min threshold is set to active).

In other words, if the signal ΔV generated by the bridge 104 is reduced from its maximum value by a defined amount (in this example 5%) then the signal of the single element is checked. If the signal of the single element is also reduced by a certain amount (in this example 5%) to its maximum value, then the bridge output is generated within the linear range and the switching threshold to generate a pulse is set to active. If the single element's signal is not reduced then the bridge signal is generated outside the linear range and the switching threshold will not be activated. The evaluation around the minimum of the bridge transfer curve is done accordingly.

In the following, exemplary applications of the current sensor 100 according to the concept of the present invention is described making reference to FIGS. 6 and 7.

Figure 6:
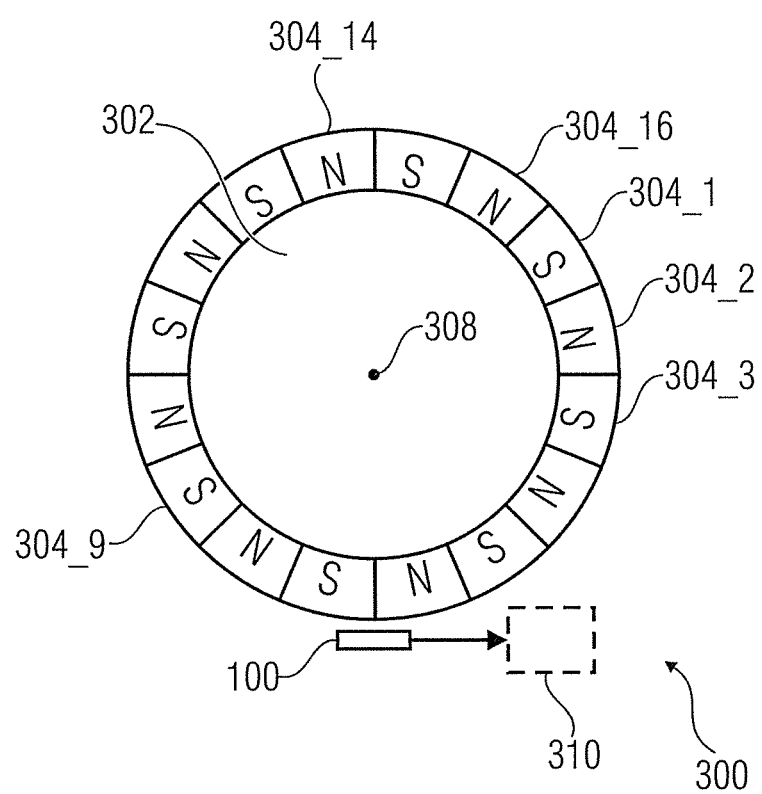
FIG. 6 shows an illustrative view of a system according to an embodiment of the present invention.

FIG. 6 shows an illustrative view of a system 300 according to an embodiment of the present invention. The system 300 comprises a body 302 comprising a plurality of structures 304_1 to 304_i for effecting a periodically varying magnetic field upon movement of the body, and the magnetic field sensor 100 shown in FIG. 1. Thereby, the at least four XMR elements 104_1 to 104_n (n≥4) are arranged adjacent to the body 302 and configured to detect a component of the periodically varying magnetic field upon movement of the body.

In FIG. 6, the body 302 comprises, for example, 16 structures 304_1 to 304_i for effecting the periodically varying magnetic field upon movement of the body. Naturally, the body 302 can comprise up to i structures 304_1 to 304_i, wherein i is a natural number.

In some embodiments, the structures 304_1 to 304_i of the body 302 can be magnetic poles arranged with alternating polarity.

Furthermore, the system 300 can comprise an evaluator 310 configured to detect a bridge signal ΔV of the full bridge circuit 104 and to evaluate a position, velocity or acceleration of the body 302 based on the detected bridge signal ΔV.

Figure 7:
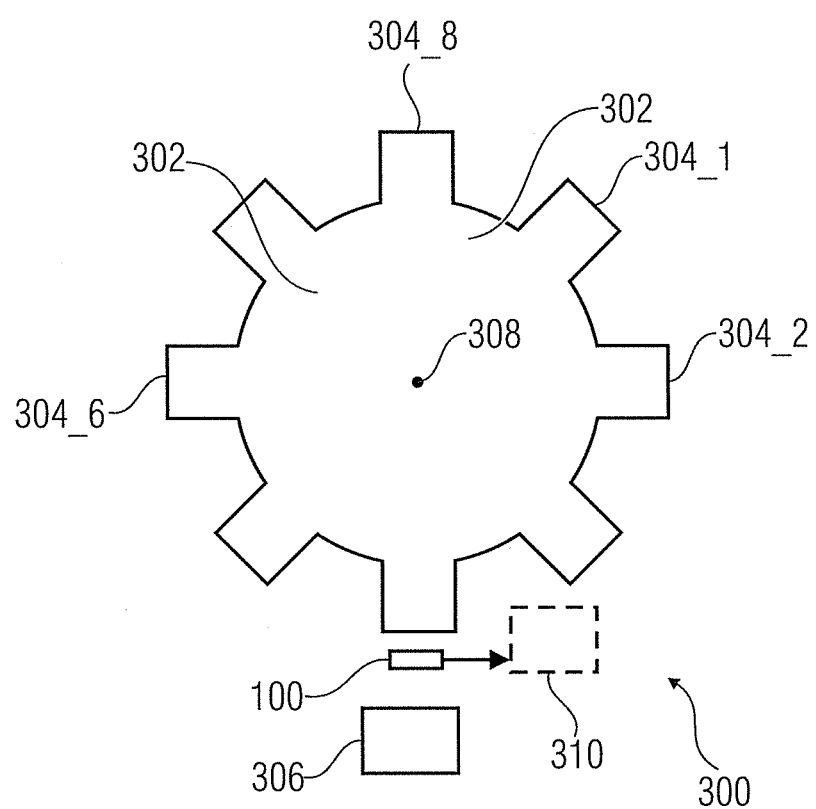
FIG. 7 shows an illustrative view of a system according to another embodiment of the present invention.

FIG. 7 shows an illustrative view of a system 300 according to another embodiment of the present invention. In contrast to FIG. 6, the system 300 comprises a magnetic element 306 arranged adjacent to the magnetic field sensor 100 (comprising the at least four XMR elements 102_1 to 102_n (n≥4)), wherein the structures 304_1 to 304_i of the body 302 comprise protrusions or recesses periodically formed at the body 302.

Referring to FIGS. 6 and 7, the body 302 can be a wheel 302 attached to a shaft 308 and configured to effect a periodically varying magnetic field upon rotation of the wheel 302.

Several embodiments can be conceived based on the present invention. Aside from the embodiment describe above it is also possible to use two bridges with opposite transfer curves and use the differential signal between these two. This will increase the signal amplitude by a factor of two.

Regarding the placement of the XMR elements 102_1 to 102_n (n≥4), the XMR elements 102_1 to 102_n (n≥4) can be placed locally as close as possible to each other to ensure that the field they measure is the same (e.g. by interlacing the structures).

Further embodiments of the present invention provide a magnetic field sensor having four XMR resistor elements 102_1 to 102_n (n=4) configured in a wheatstone bridge 104 configuration, wherein two of the elements 102_1 to 102_n (n=4) have a linear response R1 to a magnetic field different from the other two elements R2, and wherein the bridge signal is generated in a way that the difference between the two halves of the bridge is defined by the differences in the linear range.

Thereby, the sensor can be formed by GMR or TMR elements. The sensor elements can be arranged in an area less than 1 mm wide. The sensor elements can be arranged in an area less than 100 μm wide. The sensor elements can be arranged in an area less than 10 μm wide and 50 μm high. The sensor can comprise an additional XMR element. The sensor (or structure) can comprise a control circuit for evaluation validity of bridge signal, e.g. a control circuit configured to perform the method 200 as described above.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A magnetic field sensor, comprising:
   at least four XMR elements connected in a full bridge circuit comprising parallel branches;
   wherein two diagonal XMR elements of the full bridge circuit comprise the same shape anisotropy, and wherein XMR elements in the same branch of the full bridge circuit comprise different shape anisotropies
   wherein the two diagonal XMR elements of the full bridge circuit comprise a first aspect ratio defining a first shape anisotropy, and wherein the other two diagonal XMR elements of the full bridge circuit comprise a second aspect ratio defining a second shape anisotropy;
   wherein the second aspect ratio is by a factor of 1.5 to 5 smaller than the first aspect ratio; and
   wherein the at least four XMR elements are giant magneto resistive or tunnel magneto resistive elements.

2. The magnetic field sensor according to claim 1, wherein the shape anisotropies of the at least four XMR elements are defined by aspect ratios of the at least four XMR elements, wherein the aspect ratios are defined by quotients between widths and lengths in a sensing plane of the at least four XMR elements.

3. The magnetic field sensor according to claim 1, wherein the at least four XMR elements are configured to detect the same component of an external magnetic field component.

4. The magnetic field sensor according to claim 1, wherein the parallel branches comprise bridge terminals connected between the XMR elements, wherein in presence of an in-plane component of an external magnetic field a bridge signal is present between the bridge terminals.

5. The magnetic field sensor according to claim 1, wherein the parallel branches are connected in parallel between a first and second supply terminal of the full bridge circuit.

6. The magnetic field sensor according to claim 1, wherein the full bridge circuit is a Wheatstone bridge.

7. The magnetic field sensor according to claim 1, wherein at least one of the at least four XMR elements comprises at least two XMR sub elements, wherein the XMR sub elements comprise a total shape anisotropy corresponding to the one XMR element.

8. A magnetic field sensor, comprising:
   a first and a second supply terminal;
   at least two branches;
   wherein a first branch of the at least two branches comprises a series connection of a first XMR element and a second XMR element, and wherein a second branch of the at least two branches comprises a series connection of a third XMR element and fourth XMR element;
   wherein the first and second branch are connected in parallel between the first and second supply terminal, such that the first XMR element and the third XMR element are connected to the first supply terminal and the second XMR element and the fourth XMR element are connected to the second supply terminal;
   wherein the first XMR element and the fourth XMR element comprise the same shape anisotropy, wherein the first XMR element and the second XMR element comprise different shape anisotropies, and wherein the third XMR element and the fourth XMR element comprise different shape anisotropies;
   wherein the first and fourth XMR elements comprise a first aspect ratio defining a first shape anisotropy, and wherein the second and third XMR elements comprise a second aspect ratio defining a second shape anisotropy;
   wherein the second aspect ratio is by a factor of 1.5 to 5 smaller than the first aspect ratio
   wherein the XMR elements are giant magneto resistive (GMR) or tunnel magneto resistive (TMR) elements.

9. The magnetic field sensor according to claim 8, wherein the second XMR element and the third XMR element comprise the same shape anisotropy.

10. The magnetic field sensor according to claim 8, wherein the shape anisotropies of the first XMR element to the fourth XMR element are defined by their aspect ratios, wherein the aspect ratios are defined by quotients between widths and lengths in a sensing plane of the at least four XMR elements.

11. The magnetic field sensor according to claim 8, wherein the first XMR element to the fourth XMR element are configured to detect the same component of an external magnetic field.

12. The magnetic field sensor according to claim 8, wherein the first branch comprises a first bridge terminal connected between the first XMR element and the second XMR element, and wherein the second branch comprises a second bridge terminal connected between the third XMR element and the fourth XMR element, wherein in presence of an in-plane component of an external magnetic field a bridge signal is present between the first bridge terminal and the second bridge terminal.

13. A system, comprising:
   a body comprising a plurality of structures for effecting a periodically varying magnetic field upon movement of the body;
   at least four XMR elements connected in a full bridge circuit comprising parallel branches;
   wherein two diagonal XMR elements of the full bridge circuit comprise the same shape anisotropy, and wherein XMR elements in the same branch of the full bridge circuit comprise different shape anisotropies;
   wherein the at least four XMR elements are arranged adjacent to the body and configured to detect a component of the periodically varying magnetic field upon movement of the body;
   wherein the first and fourth XMR elements comprise a first aspect ratio defining a first shape anisotropy, and wherein the second and third XMR elements comprise a second aspect ratio defining a second shape anisotropy;

wherein the second aspect ratio is by a factor of 1.5 to 5 smaller than the first aspect ratio;

wherein the at least four XMR elements are giant magneto resistive or tunnel magneto resistive elements.

14. The system according to claim 13, wherein the structures of the body are magnetic poles arranged with alternating polarity.

15. The system according to claim 14, further comprising a magnetic element arranged adjacent to the at least four XMR elements, wherein the structures of the body comprise protrusions or recesses periodically formed at a gear.

16. The system according to claim 15, further comprising an evaluator configured to detect a bridge signal of the full bridge circuit and to evaluate a position, velocity or acceleration of the body based on the detected bridge signal.

* * * * *